United States Patent
Farjad-Rad

(10) Patent No.: US 7,844,023 B2
(45) Date of Patent: *Nov. 30, 2010

(54) PHASE OFFSET CANCELLATION FOR MULTI-PHASE CLOCKS

(75) Inventor: Ramin Farjad-Rad, Mountain View, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/251,792

(22) Filed: Oct. 15, 2008

(65) Prior Publication Data

US 2009/0097605 A1   Apr. 16, 2009

Related U.S. Application Data

(63) Continuation of application No. 10/764,003, filed on Jan. 22, 2004, now Pat. No. 7,443,941.

(60) Provisional application No. 60/441,911, filed on Jan. 22, 2003.

(51) Int. Cl.
*H03L 5/00* (2006.01)

(52) U.S. Cl. .................. 375/373; 375/355; 327/307

(58) Field of Classification Search ........... 375/371, 375/373, 226, 294, 327, 375, 155, 355; 327/147, 327/148, 149, 150, 151, 152, 153, 154, 155, 327/144, 156, 157, 158, 159, 161, 244, 307; 331/156, 157, 158, 159

See application file for complete search history.

(56) References Cited

U.S. PATENT DOCUMENTS

| | | | |
|---|---|---|---|
| 5,548,251 A * | 8/1996 | Chou et al. | .................... 331/57 |
| 5,663,665 A * | 9/1997 | Wang et al. | ..................... 327/3 |
| 6,052,011 A | 4/2000 | Dasgupta | |
| 6,100,767 A | 8/2000 | Sumi | |
| 6,111,445 A | 8/2000 | Zerbe et al. | |
| 6,275,072 B1 | 8/2001 | Dally et al. | |
| 6,388,482 B1 * | 5/2002 | Schnell et al. | ............... 327/158 |

(Continued)

OTHER PUBLICATIONS

Non-Final Office Action for U.S. Appl. No. 10/764,003, filed Jan. 22, 2004 and mail date of Dec. 11, 2007 with Notice of References Cited. 14 pages.

(Continued)

*Primary Examiner*—Chieh M Fan
*Assistant Examiner*—Aristocratis Fotakis

(57) ABSTRACT

A system for use with a multi-phase clock generator is disclosed. It should also be understood that the multiphase clock generator can be a phase lock loop (PLL), delay lock loop (DLL), or any other circuit capable of providing a multiphase clock. The system comprises at least two phase detectors coupled to the multi-phase clock generator for receiving component clock signals of the multi-phase clock generator, wherein at least some of the component clock signals are offset from each other in phase. Each of the phase detectors detects phase differences between pairs of component clock signals. The system includes a summer coupled to the at least two phase detectors for measuring the phase differences between the at least two phase detectors. The system includes at least one variable delay element for receiving the measured phase difference and for providing a delay which is proportional to an output value of the summer. The delay is used to reduce the phase differences.

25 Claims, 6 Drawing Sheets

U.S. PATENT DOCUMENTS

| | | |
|---|---|---|
| 6,486,716 B1 * | 11/2002 | Minami et al. ............... 327/152 |
| 6,978,012 B2 | 12/2005 | Casper |
| 7,065,025 B2 | 6/2006 | Kiyose |
| 7,136,445 B2 | 11/2006 | Houtman |
| 7,414,445 B2 * | 8/2008 | Heyne ........................ 327/158 |
| 2001/0043649 A1 | 11/2001 | Farjad-Rad |
| 2002/0049936 A1 | 4/2002 | Gutnik et al. |
| 2002/0085656 A1 | 7/2002 | Lee et al. |
| 2002/0140512 A1 | 10/2002 | Stockton |
| 2003/0012321 A1 * | 1/2003 | Tokutome et al. ........... 375/376 |
| 2003/0174003 A1 | 9/2003 | Nogami |
| 2007/0047689 A1 | 3/2007 | Menolfi et al. |

OTHER PUBLICATIONS

Response to Office Action, U.S. Appl. No. 10/764,003, filed Jan. 22, 2004 mailed to the USPTO on Apr. 8, 2008. 13 pages.

Park et al., A 1.8 GHz Self-Calibrated Phase-Locked Loop with Precise I/Q Matching, IEEE Journal of Solid-State Circuits, vol. 36, No. 5, May 2001, pp. 777-783.

B. Razavi, Design Considerations for Direct-Conversion Receivers, IEEE Transactions on Circuits and Systems-II: Analog and Digital Signal Processing, vol. 44, No. 6, Jun. 1997, pp. 428-435.

Yang et al., A 0.5-um CMOS 4.0 Gbit/s Serial Link Transceiver with Data Recovery Using Oversampling, IEEE Journal of Solid-State Circuits, vol. 33, No. 5, May 1998, pp. 713-718, 720-722.

Yu et al., A Novel Adaptive Mismatch Cancellation System for Quadrature IF Radio Receivers, IEEE Transactions on Circuits and Systems-II: Analog and Digital Signal Processing, vol. 46, No. 6, Jun. 1999, pp. 789-795, 798-801.

* cited by examiner

… (US 7,844,023 B2)

PHASE OFFSET CANCELLATION FOR MULTI-PHASE CLOCKS

CROSS-REFERENCE TO RELATED APPLICATIONS

This application is a continuation of U.S. patent application Ser. No. 10/764,003, filed Jan. 22, 2004, now U.S. Pat. No. 7,443,941, all of which is incorporated herein by reference, which claims the benefit of U.S. Provisional Application No. 60/441,911, filed Jan. 22, 2003.

FIELD OF THE INVENTION

The present invention relates generally to integrated circuits and more particularly to phase offset cancellation techniques for use with multi-phase clocks.

BACKGROUND OF THE INVENTION

Multi-phase clock generators have a wide range of applications in radio-frequency (RF) and mixed-mode (MM) circuits. For example, many RF communications circuits use quadrature amplitude modulation (QAM) for efficient use of the channel bandwidth. A QAM modulator uses an in phase and quadrature phase component of a RF frequency, which are 90 degrees apart in phase, to modulate two stream of base-band data with bandwidth of $\Delta f$ in a single channel of $\Delta f$.

In serial wireline communication circuits, lower frequency multi-phase clocks can be used to serialize or deserialize the low-speed parallel data into a high-speed serial stream of data. FIG. 1 is a diagram that illustrates a multi-phase sampling scheme for serial link communications. As is seen, there is an input data line 12 which is coupled to a plurality of component clock signals ck0-ck4. Each clock 14a-14d is coupled to a respective sampler (16a-16d). Each clock 14a-14d clocks the sampling instant that its respective sampler will use to determine the value of the input data line 12. As is also seen, there are wave forms that represent a set of component clock signals 18a-18d for the multi-phase clock that correspond to clock signals 14a-14d respectively. As is seen, each sampler samples the data from data line 12 on the rising edge. The advantage of using multi-phase clock generators in multi-gigabit serial links is generating an on-chip multi-GHz clock.

However, a major problem that can limit the use of multi-phase clock generation for high-speed data communication or RF communication is the phase offset between the adjacent clock phases, which directly degrades the performance of the system.

FIG. 2 is a block diagram illustrating the same sampling scheme as FIG. 1, except there are phase offsets, for example, as shown, samplers 14a', 14b' and 14c'. As is seen, in this diagram only sampler 14d receives the full data signal. This phase offset is caused by a number of sources, including but not limited to, mismatch in different stages of a multi-stage oscillator, the oscillator clock buffers, and periodic ripples on the oscillator or buffers control signal and supply voltage.

In QAM systems, phase offset between in phase and quadrature phases results in interference between the two quadrature RF bands of data. In serial communication, phase offset shows up as a timing error that degrades system performance both in the transmitting and receiving of data. In data transmission using multiple phases, phase error among clock phases causes a data symbols to be longer and a symbol to be shorter than the idea symbol width. The shorter data symbols are harder to be detected by the receiver as they have less timing margin. In the receiver, multiple clock phase error results in timing error in sampling of data that effectively increases system bit error rate (BER) by sampling the data symbol at a non-ideal point.

Other techniques have been adopted in the past to address the phase offset problem in multi-phase clock generators. For example, a technique proposed in C.-H. Park, et. al., "A 1.8 GHz Self-Calibrated Phase-Locked Loop with Precise I/Q Matching," IEEE JSSC, May 2001, pp. 777-783, has the advantage that it used only one phase detector to correct all phases, by switching the phase detector to measure the difference between a reference signal and multiple phases from a multi-stage oscillator at a time, and apply the output of the phase detector to the corresponding delay adjusting circuit for that phase. The advantage of this scheme is that it does not suffer from mismatches in the phases detector. However, a major drawback of this approach is that the phases from the multi-stage oscillator go through multiple stages of retiming and multiplexing before final correction by the phase detector loop.

As a result, although the phase offset of the clock phases after the retiming and multiplexing stages are zero, the original phase will still experience some phase error due to mismatch in different retiming and multiplexing paths for each phase. In addition, this scheme is much more complex in implementation and the active area used in the scheme is more than an order of magnitude larger than the proposed design in this application.

Another approach as proposed in L. Yu and W. M. Snelgrove entitled "A novel adaptive mismatch cancellation system for quadrature IF radio receivers," IEEE Trans. Circuits Syst. II, June 1999, pp. 789-801, adds complexity in the clock signal path that limits the performance of the system, is also limited to just few applications, e.g. image rejection in RF systems.

Finally, an approach proposed in B. Razavi, "Design considerations for direct conversion receivers," IEEE Trans. Circuits Syst. II, June 1997, pp. 428-435, has the advantage of simplicity of design and does not introduce complexity in the clock signal path, however, it does not offer a continuous adjustment during circuit operation. This is a serious drawback for circuits that are sensitive to temperature and voltage variations during operation.

Accordingly, what is needed is a system and method for minimizing phase offset in a communications circuit that overcomes the above-identified problems. The system should be competitive with existing integrated circuits, should be easily implemented and cost effective. The present invention addresses such a need.

DETAILED DESCRIPTION

Figure 1:
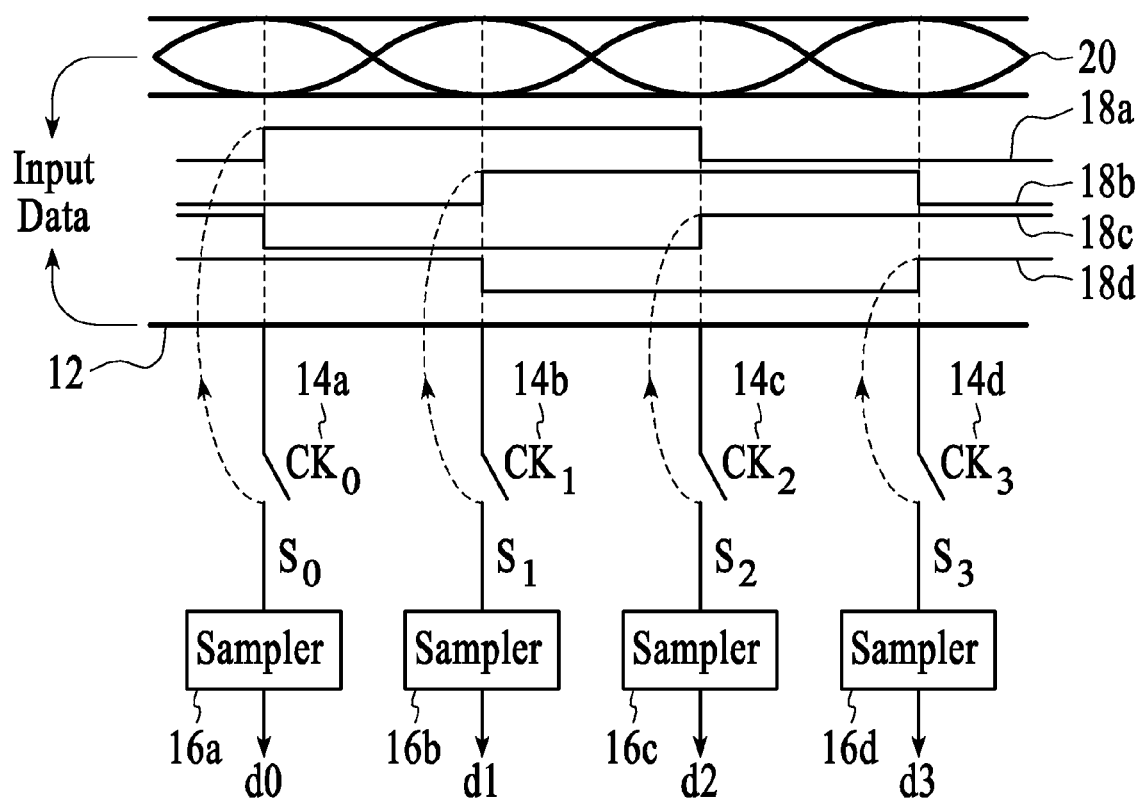
FIG. 1 is a diagram that illustrates a multi-phase sampling scheme for serial link communications.
Figure 2:
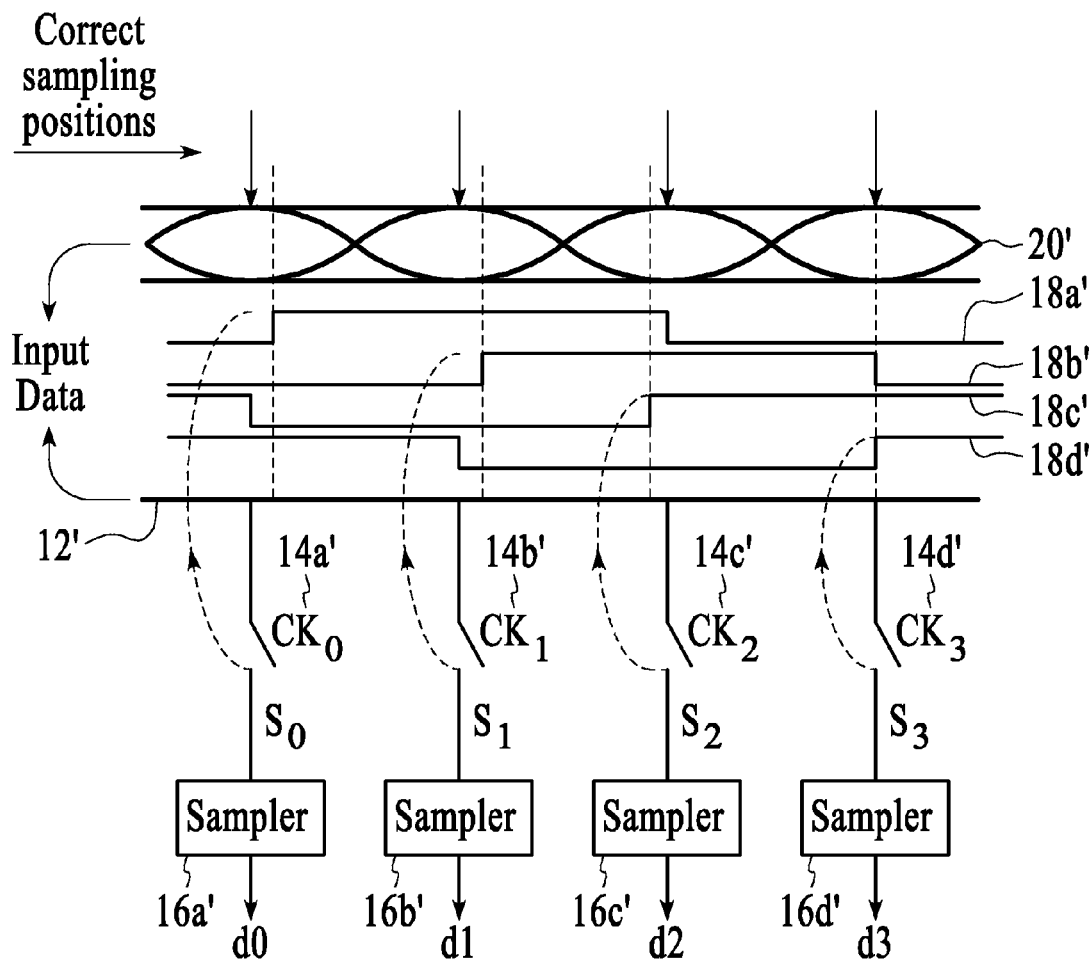
FIG. 2 is a block diagram illustrating the same sampling scheme as FIG. 1, except there are phase offsets.

The present invention relates generally to integrated circuits and more particularly to phase offset cancellation techniques for use with multi-phase clocks. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

A system for use with a multi-phase clock generator is disclosed. It should also be understood that the multiphase clock generator can be a phase lock loop (PLL), delay lock loop (DLL), or any other circuit capable of providing a multiphase clock. The system comprises at least two phase detectors coupled to the multi-phase clock generator for receiving component clock signals of the multi-phase clock generator, wherein at least some of the component clock signals are offset from each other in phase. Each of the phase detectors detects phase differences between pairs of component clock signals. The system includes a summer coupled to the at least two phase detectors for measuring the phase differences between the at least two phase detectors. The system includes at least one variable delay element for receiving the measured phase difference and for providing a delay which is proportional to an output value of the summer. The delay is used to reduce the phase differences.

In a preferred embodiment of a system and method in accordance with the present invention, adjacent phase differences are equalized utilizing a phase cancellation mechanism for multi-phase clock generator circuits. In this circuit each phase detector within the phase cancellation mechanism measures the phase spacing of the two component clock signals, and the difference between the two component clock signals is applied to an adjustable delay element by a subtractor to cancel the phase error of a particular stage. In so doing, phase offsets can be cancelled in multi-phase clock generator in an efficient and effective manner.

In a preferred embodiment of a system and method in accordance with the present invention, adjacent phase differences are reduced utilizing a phase cancellation mechanism. Therefore, the phase of a component clock signal, cki0, is fixed as the phase reference, and the phase of a next component clock signal, cki1, is adjusted in such a way that the phase difference between a first adjacent pair of clocks is equal to a next adjacent pair of clocks. The same mechanism may be used to adjust a next component clock signal ck2, and so on. Each phase detector within the phase cancellation mechanism measures the phase spacing of the two adjacent clocks, and the difference between the two adjacent phase spacings is applied to an adjustable delay element by a subtractor to cancel the phase error of a particular component clock signal.

Figure 3:
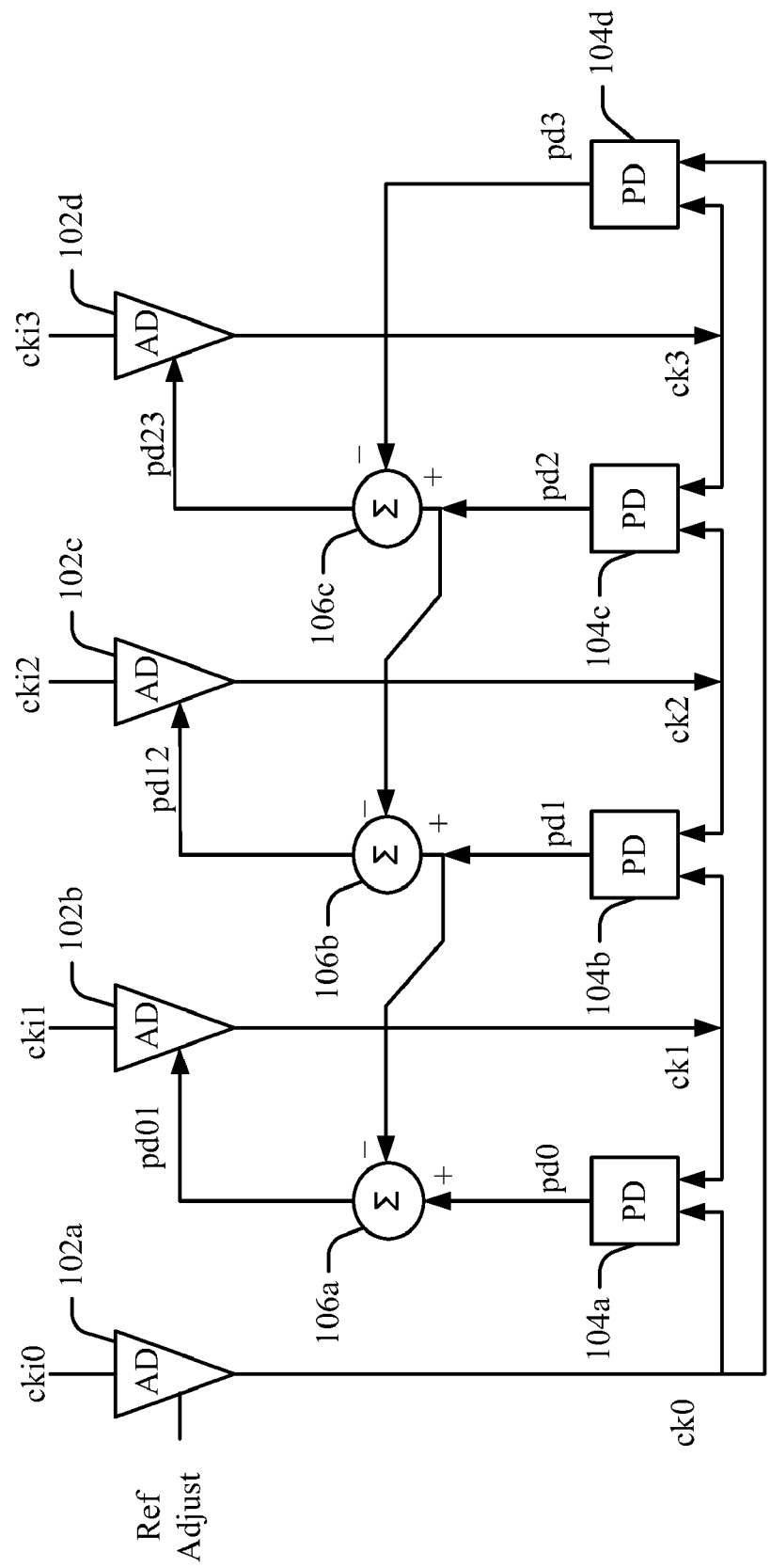
FIG. 3 illustrates a first embodiment of a phase-offset cancellation mechanism in accordance with the present invention.
Figure 4:
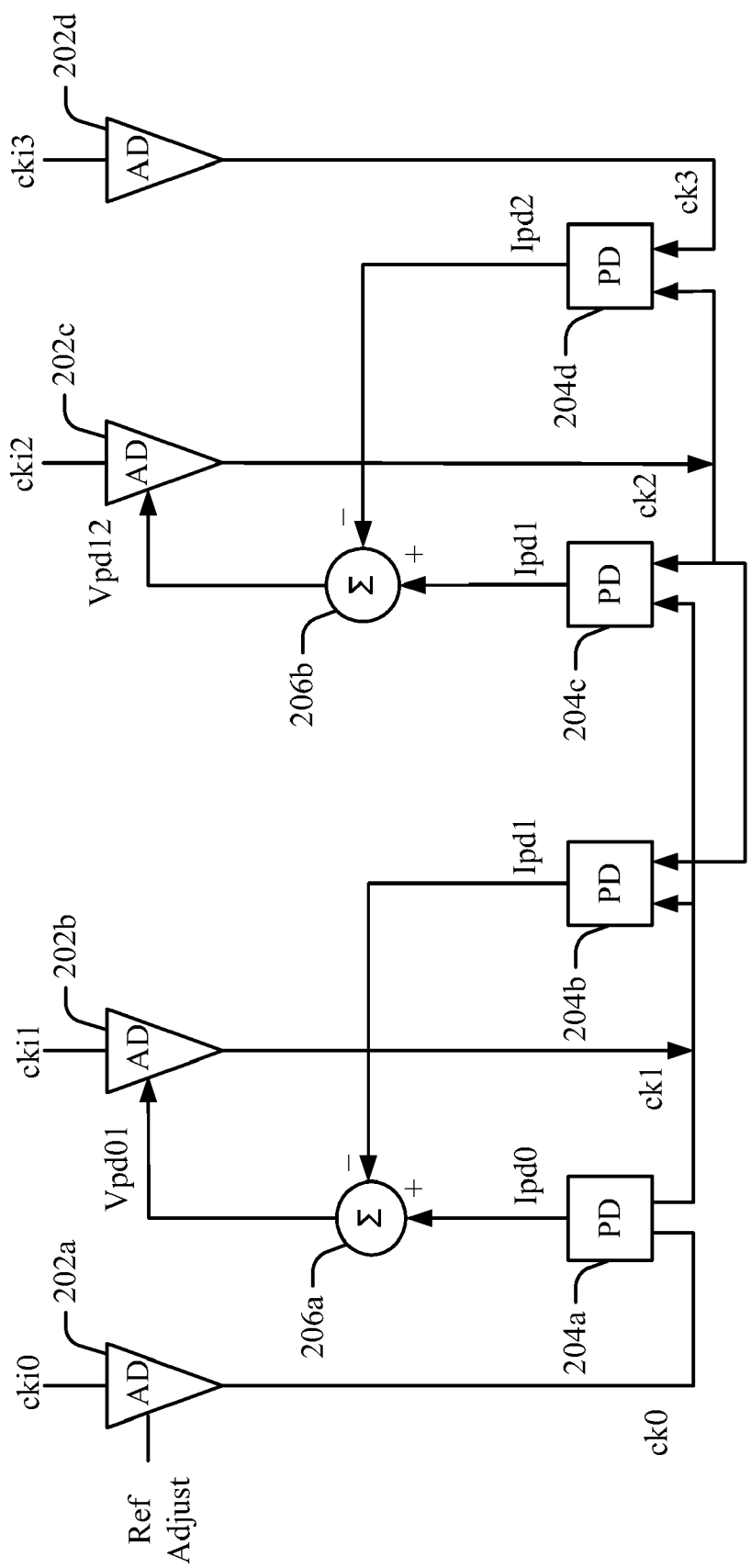
FIG. 4 illustrates a second embodiment of a phase offset cancellation mechanism.

To describe the features of the present invention in more detail, refer now to the following description in conjunction with the accompanying figures. FIG. 3 illustrates a first embodiment of a phase-offset cancellation mechanism 100 in accordance with the present invention. FIG. 4 illustrates a second embodiment of a phase cancellation circuit 200 in accordance with the present invention. As is seen, since the output of each of the phase detectors 204a-204d is a current instead of a voltage a separate phase detector per input of the summing block is required. Either of the phase-offset cancellation mechanisms 100 or 200 can be coupled to the multi-phase clock generator 10 of FIG. 1 via the serial line input data line 12 to provide the appropriate phase-offset cancellation.

Each of these embodiments illustrate a four-phase system with almost equal phase spacings provides the offset cancellation scheme. The four component clock signals (cki0 to cki3) can be the output of a multi-phase clock generation circuit that experiences phase errors due to the mismatches in the clock generation circuit and its following buffers. It should be understood that, although the present invention is described with respect to a four-phase system, the same architecture can be extended to any equally spaced multiple phase system and it would be within the spirit and scope of the present invention.

Referring back to FIG. 3, there are a plurality of adjustable delays 102a-102d, a plurality of summers, 106a-106c, and a plurality of phase detectors 104a-104d. In this embodiment, component clock signal cki0 is input to adjustable delay 102a, and it provides an output of component clock signal ck0. That output is provided to phase detector 104a. As is also seen, a cki1 is provided to an adjustable delay 104a and it provides an output component clock signal ck1. The output from phase detector 104a (pd0) is provided to summer 106a.

A negative output from summer 106a is provided to a positive input of summer 106b. The output from summer 106a (pd01) is provided to the adjustable delay 102b. The output (pd1) of the phase detector 104b is also provided to the positive input summer 106b. The output (pd1) of summer 106b is provided to adjustable delay 102c. The input of adjustable delay 102c is component clock signal cki2. The output of adjustable delay 102c is provided to the phase detector 104b and phase detector 104c. The phase detector 104c provides an output (pd2) to the negative input of summer 106c. The negative output of summer 106b is provided to the positive input of summer 106c. The input to adjustable delay 102d is component clock signal cki3. The output (pd23) from summer 106 is provided to adjustable delay 102d. The output from adjustable delay 102d is provided to the input of phase detector 104c and the input of phase detector 104d. The output from adjustable delay 102a is also provided to the phase detector 104d.

The phase detectors 104a-104d convert the phase difference between two component clock signals into a proportional current, and the analog subtractor within the summers 106a-106c uses the current difference from two adjacent phase detectors to charge and discharge a capacitor (not shown) at its output.

Accordingly, a key feature of a preferred embodiment of the present invention is to equalize every two adjacent phase differences. Therefore, the phase of the first component clock signal, cki0, is fixed as the phase reference, and the phase of the next component clock signal, cki1, is adjusted in such a way that the phase difference between component clock signal ck0 and component clock signal ck1 (pd0) is equal to component clock signal ck1 and component clock signal ck2 (pd1). The same mechanism may be used to adjust the next clock phase ck2, and so on. Each phase detector 104a-104d measures the phase spacing of the two adjacent clocks, pdi, and the difference between pdi and pdi+1 is applied to the adjustable delay element by a subtractor to cancel the phase error of that stage. It should be noted that in alternative embodiments of the present invention, the techniques described herein may be used to equalize phase differences between anyone or more pairs of component clock signals.

Figure 5:
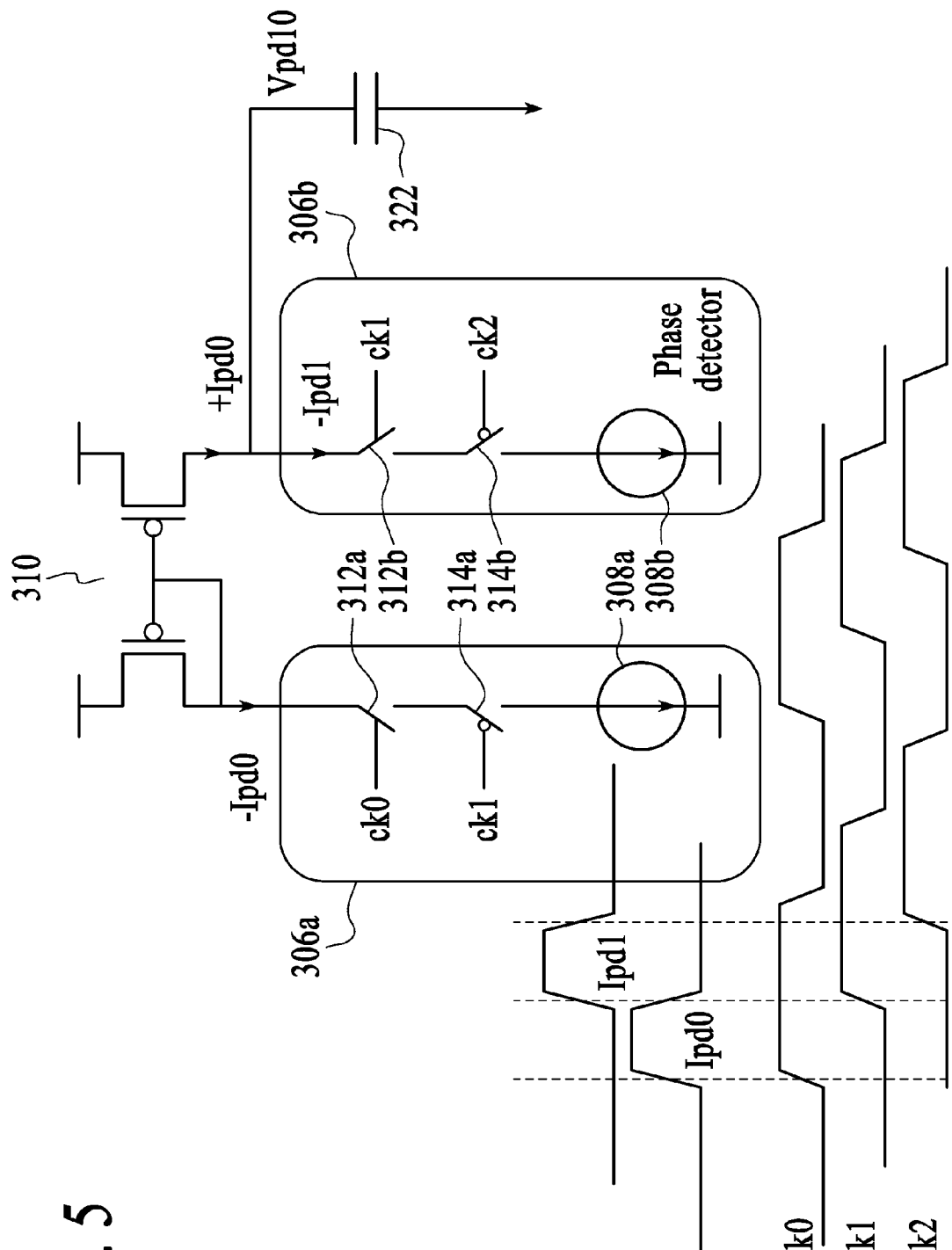
FIG. 5 is a diagram for a subtractor and two phase detectors in accordance with the present invention.

To describe the features of the phase detector and subtractor in more detail refer now to the following description in conjunction with the accompanying figures. FIG. 5 is a diagram for a subtractor and two phase detectors 306a and 306b in accordance with the present invention. Each phase detector 306a and 306b generates a current pulse whose width is proportional to the phase difference between the two input component clock signals, as the current only flows into the branch when both switches 312a, 312b and 314a and 314b the current source 308a and 308b are closed at the same time. The subtraction is performed using current summing of the current from the right branch and inverted current from the left branch through a mirror circuit 310. If one phase difference is larger than the other phase difference, voltage on the capacitor 322 will change in a direction to move the common clock edge, e.g., component clock signals ck1, in the two pairs of clock phases, e.g. ck0/ck1 and ck1/ck2, to correct for this difference through the adjustable delay element.

Any additional phase offset is a result of the mismatches in the phase detector 306a, 306b and subtractor combination. The main source of mismatch in this circuit is mismatch between the two current sources 308a and 308b and the mirror circuit 310. Since these elements are not needed to operate at a very high frequency, they can be implemented with very large device sizes to maximize the matching.

Figure 6:
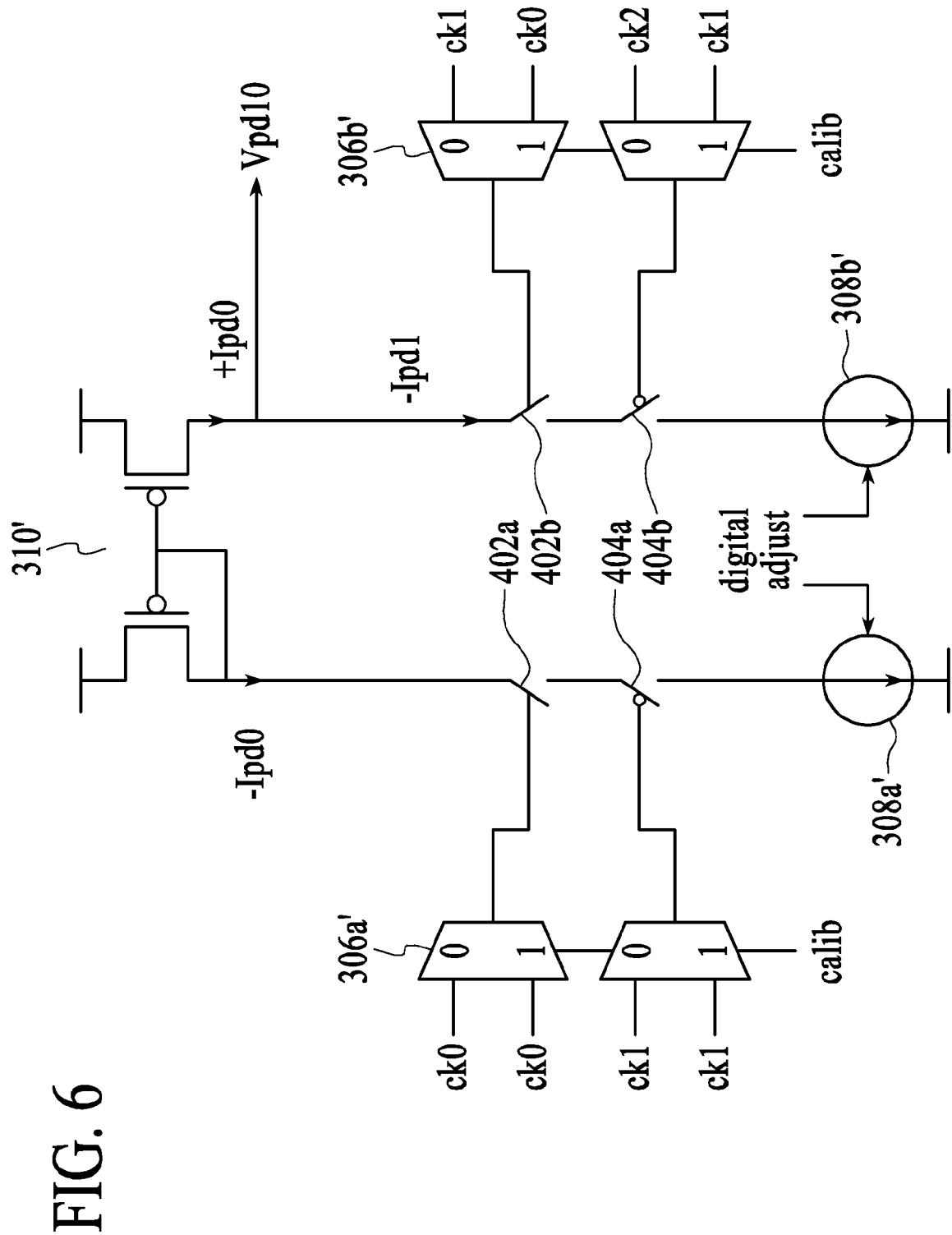
FIG. 6 is a mechanism for device mismatch cancellation in accordance with the present invention.

To further reduce the effect of mismatch in the phase detector current sources and mirror devices, a device mismatch cancellation scheme is implemented to cancel out the offset in the current pulses at the output of the circuit. FIG. 6 is a mechanism for device mismatch cancellation in accordance with the present invention. In this scheme, as shown in FIG. 4, the current sources 308a' and 308b' in the phase detectors 306a' and 306b' are adjustable DACs (digital to analog converters), whose amplitude can be digitally adjusted to compensate for the mismatch in the down (Ipd1) and up (Ipd0) current at the output nodes when the input clocks have the same phase difference.

During the calibration mode when the calibration signal is high, the inputs to the two phase detectors 306a' and 306b' are exactly the same (i.e. both sides receive ck0 and ck1) with devices 402a, 402b and 404a, 404b respectively. Therefore, in an ideal circuit without any device mismatch, the up and down current pulses dump the same amount of charge into the capacitor in opposite directions that cancel out each other and capacitor voltage does not change. In the instance of a mismatch, the current in one branch is higher than the other and thus the net charge dumped into the capacitor (not shown) decreases or increases continuously till it reaches ground (0V) or supply voltage (Vdd). A controller (not shown) senses the output of the circuit (Vpd10) and searches for an adjustment setting in the digitally controlled current sources to find the setting where Vpd10 moves from one supply rail to another (e.g. Vdd to ground). That setting is the one that minimizes the circuit offset due to mismatch.

CONCLUSION

In a system and method in accordance with the present invention, adjacent phase differences are equalized utilizing a phase cancellation mechanism for multi-phase clock generator circuits. In this circuit each phase detector within the phase cancellation mechanism measures the phase spacing of the two component clock signals, and the difference between the two component clock signals is applied to an adjustable delay element by a subtractor to cancel the phase error of a particular stage. In so doing, phase offsets can be cancelled in multi-phase clock generator in an efficient and effective manner.

Accordingly, the multi-phase clock generator after the phase offset has been cancelled can be utilized in a variety of applications including but not limited to (1) a transmit clock used for timing a driver in a transmitter; (2) a receiver clock used for timing a sampler in a receiver; (3) in a transceiver circuit where one or both of the transmit and receive portions are timed by the multi-phase clock; or (4) in a communication channel having a transmitter and a receiver, where one or both of the transmitter and receiver use a multi-phase clock that has been phase cancelled.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

The invention claimed is:

1. A phase offset cancellation apparatus, comprising:
    two phase detectors for receiving component clock signals of a multi-phase clock generator, each providing a first output dependent upon a phase difference between a corresponding pair of the component clock signals;
    a circuit coupled to the two phase detectors to produce a second output dependent on a difference between the first outputs; and
    a variable delay element coupled to the circuit to provide a delay proportional to the second output, wherein the delay is used to equalize the phase differences between the pairs of component clock signals.

2. The apparatus of claim 1, wherein each of the phase detectors measures a phase spacing of adjacent component clock signals.

3. The apparatus of claim 1, wherein each of the phase detectors comprise:
    a current source; and
    two switches coupled to the current source, the two switches receiving a first and a second component clock signal, wherein when the two switches are closed the phase detector generates an indication of the difference between the first and second clock signals.

4. The apparatus of claim 1, wherein circuit includes:
    a mirror circuit coupled to the phase detectors for detecting a difference between outputs of the phase detectors; and
    a capacitor coupled to the mirror circuit for charging or discharging based upon the detected difference.

5. The apparatus of claim 1, wherein the each of the phase detectors provides a voltage as an output.

6. The apparatus of claim 1, wherein the each of the phase detectors provides a current as an output.

7. The apparatus of claim 1, wherein each of the phase detectors is calibrated to minimize device mismatch within the phase detector.

8. The apparatus of claim 1, wherein the pairs of component clock signals are not identical pairs.

9. The apparatus of claim 1, further comprising:
    another phase detector for receiving at least one other component clock signal of the multi-phase clock generator, for providing another first output dependent upon a phase difference between another corresponding pair of the component clock signals;
    another circuit coupled to one of the two phase detectors and the another phase detector to produce another second output dependent on a difference between one of the first outputs and the another first output; and
    another variable delay element coupled to the another circuit to provide another delay proportional to the another second output, wherein the another delay is used to equalize the phase differences between one of the pairs of component clock signals and the another pair of component clock signals.

10. A multi-phase clock generator, comprising:
a plurality of clocks for clocking input data;
a plurality of samplers coupled to the plurality of clocks for receiving the input data, each of the samplers receiving a different clock phase; and
a phase offset cancellation system coupled to the plurality of clocks, the phase offset cancellation system further comprising: two phase detectors for receiving component clock signals of the multi-phase clock generator, each providing a first output dependent upon a phase difference between a corresponding pair of the component clock signals; a circuit coupled to the two phase detectors to produce a second output dependent on a difference between the first outputs; and a variable delay element coupled to the circuit to provide a delay proportional to the second output, wherein the delay is used to equalize the phase differences between the pairs of component clock signals.

11. The multi-phase clock generator of claim 10, wherein each of the phase detectors measures a phase spacing of adjacent clocks.

12. The multi-phase clock generator of claim 10, wherein each of the phase detectors comprise:
a current source; and
two switches coupled to the current source, the two switches receiving a first and a second clock phase, wherein when the two switches are closed the phase detector generates an indication of the difference between the first and second clock phases.

13. The multi-phase clock generator of claim 10, wherein the circuit includes:
a mirror circuit coupled to the phase detectors for detecting a difference between outputs of the phase detectors; and
a capacitor coupled to the mirror circuit for charging or discharging based upon the detected difference.

14. The multi-phase clock generator of claim 10, wherein each of the phase detectors provides a voltage as an output.

15. The multi-phase clock generator of claim 10, wherein each of the phase detectors provides a current as an output.

16. The multi-phase clock generator of claim 10, wherein each of the phase detectors is calibrated to minimize device mismatch within the phase detector.

17. A system for use with a multi-phase clock generator, comprising:
a plurality of phase detectors coupled to the multi-phase clock generator for receiving clock phases from the multi-phase clock generator, wherein each of the phase detectors measures a phase spacing of adjacent clocks;
at least one summer coupled to the phase detectors for measuring at least one difference between the phase spacings measured by phase detectors; and
at least one variable delay element coupled to the at least one summer for providing at least one delay which is proportional to the at least one difference between the phase spacings, wherein the at least one delay is used to cancel phase error of the phase spacings of the adjacent clocks.

18. The system of claim 17, wherein each of the plurality of phase detectors comprises:
a current source; and
two switches coupled to the current source, the two switches receiving a first and a second clock phase, wherein when the two switches are closed the phase detector generates an indication of the difference between the first and second clock phases.

19. The system of claim 17, wherein each of the at least one summer includes:
a mirror circuit coupled to two of the phase detectors for detecting a difference between outputs of the two phase detectors; and
a capacitor coupled to the mirror circuit for charging or discharging based upon the detected difference.

20. The system of claim 17, wherein each of the phase detectors is calibrated to minimize device mismatch within the phase detector.

21. A circuit, comprising:
a multi-phase clock generator; and
phase offset cancellation circuitry, coupled to the multi-phase clock generator, the phase offset cancellation circuitry further comprising: two phase detectors for receiving component clock signals of the multi-phase clock generator, each providing a first output dependent upon a phase difference between a corresponding pair of the component clock signals; a circuit coupled to the two phase detectors to produce a second output dependent on a difference between the first outputs variable delay element coupled to the circuit to provide a delay proportional to the second output, wherein the delay is used to equalize the phase differences between the pairs of component clock signals.

22. A system, comprising:
means for generating a multi-phase clock; and
means for cancelling phase offsets in the multi-phase clock, the phase offset cancelling means comprising: two phase detectors for receiving component clock signals of the multi-phase clock each providing a first output dependent upon a phase difference between a corresponding pair of the component clock signals; a circuit coupled to the two phase detectors to produce a second output dependent on a difference between the first outputs; and variable delay element coupled to the circuit to provide a delay proportional to the second output, wherein the delay is used to equalize the phase differences between the pairs of component clock signals.

23. A transmitter, comprising:
a multi-phase clock generator;
phase offset cancellation circuitry for cancelling phase offsets of the multi-phase clock generator, the phase offset cancellation circuitry being coupled to the multi-phase clock generator, the phase offset cancellation circuitry further comprising: two phase detectors for receiving component clock signals of the multi-phase clock generator, each providing a first output dependent upon a phase difference between a corresponding pair of the component clock signals; a circuit coupled to the two phase detectors to produce a second output dependent on a difference between the first outputs; and variable delay element coupled to the circuit to provide a delay proportional to the second output, wherein the delay is used to equalize the phase differences between pairs of component clock signals; and
a driver that is clocked by the multi-phase clock generator.

24. A receiver, comprising:
a multi-phase clock generator;
phase offset cancellation circuitry for cancelling phase offsets of the multi-phase clock generator, the phase offset cancellation circuitry being coupled to the multi-phase clock generator, the phase offset cancellation circuitry further comprising: two phase detectors for receiving component clock signals of the multi-phase clock generator, each providing a first output dependent upon a phase difference between a corresponding pair of the component clock signals; a circuit coupled to the two phase detectors to produce a second output dependent on a difference between the first outputs; and variable delay element coupled to the circuit to provide a delay proportional to the second output, wherein the delay is used to equalize the phase differences between pairs of component clock signals; and a sampler that is clocked by the multi-phase clock generator.

25. A system, comprising:

a multi-phase clock generator;

a receiver coupled to the multi-phase clock generator;

a transmitter coupled to the multi-phase clock generator; and phase offset cancellation circuitry for cancelling phase offsets of the multi-phase clock generator, the phase offset cancellation circuitry being coupled to the multi-phase clock generator, the phase offset cancellation circuitry further comprising: two phase detectors for receiving component clock signals of the multi-phase clock generator, each providing a first output dependent upon a phase difference between a corresponding pair of the component clock signals; a circuit coupled to the two phase detectors to produce a second output dependent on a difference between the first outputs; and variable delay element coupled to the circuit to provide a delay proportional to the second output, wherein the delay is used to equalize the phase differences between pairs of component clock signals, wherein the transmitter and/or receiver utilize the multi-phase clock generator.

* * * * *